United States Patent
Iisaka et al.

(10) Patent No.: US 10,285,315 B2
(45) Date of Patent: May 7, 2019

(54) BOARD WORK SYSTEM, INCLUDING A TRANSFER DEVICE TO TRANSFER A FEEDER BETWEEN WORK MACHINES

(71) Applicant: FUJI CORPORATION, Chiryu (JP)

(72) Inventors: Jun Iisaka, Nisshin (JP); Takayuki Mizuno, Okazaki (JP)

(73) Assignee: FUJI CORPORATION, Chiryu (JP)

( * ) Notice: Subject to any disclaimer, the term of this patent is extended or adjusted under 35 U.S.C. 154(b) by 224 days.

(21) Appl. No.: 14/913,827

(22) PCT Filed: Sep. 12, 2013

(86) PCT No.: PCT/JP2013/074699
§ 371 (c)(1),
(2) Date: Feb. 23, 2016

(87) PCT Pub. No.: WO2015/037099
PCT Pub. Date: Mar. 19, 2015

(65) Prior Publication Data
US 2016/0212896 A1 Jul. 21, 2016

(51) Int. Cl.
*H05K 13/04* (2006.01)
*H05K 13/02* (2006.01)
*H05K 3/30* (2006.01)

(52) U.S. Cl.
CPC .......... *H05K 13/0417* (2013.01); *H05K 3/30* (2013.01); *H05K 13/021* (2013.01); *H05K 13/0408* (2013.01)

(58) Field of Classification Search
CPC ............. H05K 13/021; H05K 13/0408; H05K 13/0417; H05K 3/30
See application file for complete search history.

(56) References Cited

U.S. PATENT DOCUMENTS

| 5,104,277 A * | 4/1992 | Bullock ............. H05K 13/0061 198/345.1 |
| 5,329,692 A | 7/1994 | Kashiwagi |
| 5,456,001 A * | 10/1995 | Mori .................... H05K 13/021 29/703 |
| 5,878,484 A | 3/1999 | Araya et al. |
| 6,152,679 A | 11/2000 | Araya et al. |

(Continued)

FOREIGN PATENT DOCUMENTS

| JP | 3-29400 A | 2/1991 |
| JP | 7-336088 A | 12/1995 |
| JP | 2574703 Y2 | 6/1998 |

(Continued)

OTHER PUBLICATIONS

Japanese Office Action dated Jul. 4, 2017 in Patent Application No. 2015-536365 (with English Translation).

(Continued)

*Primary Examiner* — Minh N Trinh
(74) *Attorney, Agent, or Firm* — Oblon, McClelland, Maier & Neustadt, L.L.P.

(57) ABSTRACT

A board work system provided with multiple mounters and arranged in a line, wherein each mounter includes supply device, the supply device being configured from at least one tape feeder that supplies electronic components, and tape feeder holding table on which at least one of the tape feeders is detachably loaded.

4 Claims, 6 Drawing Sheets

(56) References Cited

U.S. PATENT DOCUMENTS

| | | |
|---|---|---|
| 6,435,808 B1 | 8/2002 | Araya et al. |
| 2008/0228304 A1 | 9/2008 | Maenishi et al. |

FOREIGN PATENT DOCUMENTS

| | | |
|---|---|---|
| JP | 2003-174299 A | 6/2003 |
| JP | 2006-269794 A | 10/2006 |
| JP | 2012-243894 A | 12/2012 |

OTHER PUBLICATIONS

Combined Chinese Office Action and Search Report dated Mar. 15, 2018 in Chinese Patent Application No. 201380079497.4 (with English translation and English translation of Category of Cited Documents).

European Office Action dated Apr. 3, 2018 in European Patent Application No. 13893594.5.

International Search Report dated Nov. 19, 2013 in PCT/JP2013/074699 filed Sep. 12, 2013.

Extended European Search Report dated Oct. 24, 2016 in Patent Application No. 13893594.5.

\* cited by examiner

BOARD WORK SYSTEM, INCLUDING A TRANSFER DEVICE TO TRANSFER A FEEDER BETWEEN WORK MACHINES

TECHNICAL FIELD

The present disclosure relates to a board work system including multiple work machines arranged in a line, a work method using the board work system, and a feeder transfer method.

BACKGROUND ART

Board work systems include multiple work machines arranged in a line. In the multiple work machines, circuit boards are conveyed from a work machine arranged at an upstream side to a work machine arranged at a downstream side, and work of mounting electronic components onto the circuit board is performed sequentially. When work of mounting electronic components is performed at each work machine in this way, it is desirable for the time required for mounting work at each work machine to be the same. This is because, in a case in which the time required for mounting work at one work machine is longer than the time required for mounting work at another work machine, circuit boards are delayed at the one work machine, and the production time for the circuit boards increases. Mounting work being performed at the work machine for which the work time is long should be performed at a work machine for which the work time is shorter, thus a feeder storing electronic components, for example, a tape feeder, is transferred from the work machine for which the work time is long to a work machine for which the work time is shorter. An example of this type of board work system is disclosed in the patent literature below.

PTL 1: JP-A-2003-174299

SUMMARY

According to the board work system disclosed in the above patent literature, it is possible to make the work time of each work machine the same by transferring feeders between work machines. However, transfer of the feeders between work machines is performed manually by operators. Due to this, there is a risk that the wrong feeder will be transferred due to human error or the like. Also, transferring feeders between work machines is extremely time-consuming work. The present disclosure takes account of such circumstances, and an object thereof is to provide a board work system and the like that enables transfer of feeders between work machines to be performed reliably without troubling operators.

In order to solve the above problem, the board work system according to an aspect of the disclosure includes multiple work machines arranged in a line which each include a conveyance device that conveys a circuit board, a mounting head that performs work of mounting electronic components with respect to a circuit board, a moving device that moves the mounting head to any position, and a component supply device which includes a feeder loading section on which at least one feeder which supplies electronic components is detachably loaded, and supplies the electronic components to a supply position of the electronic components of the at least one feeder, wherein a circuit board is conveyed from the work machine arranged upstream to the work machine arranged downstream in the multiple work machines, and work is performed with respect to the circuit board by sequentially performing work with respect to the circuit board at each of the multiple work machines, the board work system comprising: a transfer device that transfers the feeder between the feeder loading section of the component supply device of a specific work machine out of the multiple work machines, and the feeder loading section of the component supply device of the work machine which is adjacent to the specific work machine out of the multiple work machines.

According to another aspect of the disclosure, wherein the transfer device includes a first storage section for storing the feeder, and transfers the feeder between the feeder loading section of the specific work machine and the first storage section, or between the feeder loading section of the adjacent work machine and the first storage section, further wherein the first storage section is provided between the feeder loading section of the specific work machine and the feeder loading section of the adjacent work machine, outside the movement range of the mounting head due to the moving device of the specific work machine, and outside the movement range of the mounting due to the moving device of the adjacent work machine.

According to another aspect of the disclosure, wherein the transfer device includes a second storage section for storing the feeder, and transfers the feeder between the feeder loading section of the specific work machine and the second storage section, or between the feeder loading section of the adjacent work machine and the second storage section, further wherein the second storage section is provided below the feeder loading section of the specific work machine and the feeder loading section of the adjacent work machine.

According to another aspect of the disclosure, wherein the component supply device includes a nozzle storage unit, which stores at least one suction nozzle for picking up and holding an electronic component, that is detachably loaded on the feeder loading section, and supplies the suction nozzle to a supply position of the nozzle storage unit loaded on the feeder loading section, further wherein the transfer device transfers the nozzle storage unit between the feeder loading section of the specific work machine and the second storage section.

According to another aspect of the disclosure, wherein the feeder loading section includes a bottom surface support section that supports a bottom surface of the feeder from below, further wherein the length of the bottom surface support section is shorter than the length of the bottom surface of the feeder.

According to another aspect of the disclosure, a method is provided for equalizing the work time of a first work machine and a second work machine which is adjacent to the first work machine, in which a feeder is moved between the first work machine and the second work machine, wherein each of the first work machine and the second work machine includes a conveyance device that conveys a circuit board, a mounting head that performs work of mounting electronic components with respect to a circuit board, a moving device that moves the mounting head to any position, and a component supply device which includes a feeder loading section on which at least one feeder which supplies electronic components is detachably loaded, and supplies the electronic components to a supply position of the electronic components of the at least one feeder, the work method comprising: a transfer process in which the feeder is moved by the transfer device between the feeder loading section of the component supply device of one of the first work machine and the second work machine, and the feeder loading section of the component supply device of the other of the first work machine and the second work machine, such that, in a case in which there is a difference in the work time of the first work machine and the work time of the second work machine, the work time of the first work machine and the work time of the second machine become the same or less different, and a mounting process in which the electronic components supplied by the feeder transferred in the transfer process are mounted on a circuit board.

According to another aspect of the disclosure, the method uses multiple work machines arranged in a line which each include a conveyance device that conveys a circuit board, a mounting head that performs work of mounting electronic components with respect to a circuit board, a moving device that moves the mounting head to any position, and a component supply device which includes a feeder loading section on which at least one feeder which supplies electronic components is detachably loaded, and supplies the electronic components to a supply position of the electronic components of the at least one feeder, wherein a circuit board is conveyed from the work machine arranged upstream to the work machine arranged downstream in the multiple work machines, and work is performed with respect to the circuit board by sequentially performing work with respect to the circuit board at each of the multiple work machines, the feeder transfer method comprising: a transfer process in which a transfer device transfers the feeder between the feeder loading section of the component supply device of a specific work machine out of the multiple work machines, and the feeder loading section of the component supply device of the work machine which is adjacent to the specific work machine out of the multiple work machines.

EFFECTS

According to another aspect of the disclosure, feeders are automatically transferred between a specific work machine (hereinafter sometimes referred to as a first work machine) out of multiple work machines, and an adjacent work machine to the specific work machine (hereinafter sometimes referred to as a second work machine). This allows for feeders to be reliably transferred between work machines without troubling operators.

According to another aspect of the disclosure, a first storage section for storing feeders is provided between the feeder loading section of the first work machine and the feeder loading section of the second work machine, outside the movement of the mounting head of the first work machine, and outside the movement range of the mounting head of the second work machine. Further, feeders are also automatically transferred between the first storage section and the work machines. In other words, dead space which is outside the movement range of the mounting head of the first work machine and outside the movement range of the mounting head of the second work machine is used as feeder storage space. By this, effective use is made of empty space of the work machines, and many feeders can be stored.

According to another aspect of the disclosure, a second storage section for storing feeders is provided below the feeder loading section of the first work machine and the feeder loading section of the second work machine. Further, feeders are also automatically transferred between the second storage section and the work machines. Usually, there is a large empty space below the feeder loading section of the first work machine and the feeder loading section of the second work machine; this space is effectively used and many feeders can be stored.

According to another aspect of the disclosure, a nozzle storage unit that stores at least one suction nozzle is automatically transferred between the first work machine and the second work machine. Accordingly, it is not necessary to equip each of the two work machines with a nozzle storage unit, thus reducing costs.

According to another aspect of the disclosure, a bottom surface support section is provided on the feeder loading section on which feeders are loaded, and the bottom surface of feeders is supported by the bottom surface support section. Further, the length of the bottom surface support section is shorter than the length of the bottom surface of the feeder. Accordingly, when a feeder is removed from the feeder loading section, the amount that the feeder is moved can be made small such that removal of feeders from the feeder loading section can be performed smoothly.

According to another aspect of the disclosure, in a case in which there is a difference in the mounting time between the first work machine and the second work machine, feeders are automatically transferred between the first work machine and the second work machine such that the respective work times become the same or less different. Accordingly, the work time of multiple work machines can be appropriately equalized.

DESCRIPTION OF EMBODIMENT

The following describes in detail referring to the figures an example embodiment of the present disclosure.

Configuration of Board Work System

Figure 1:
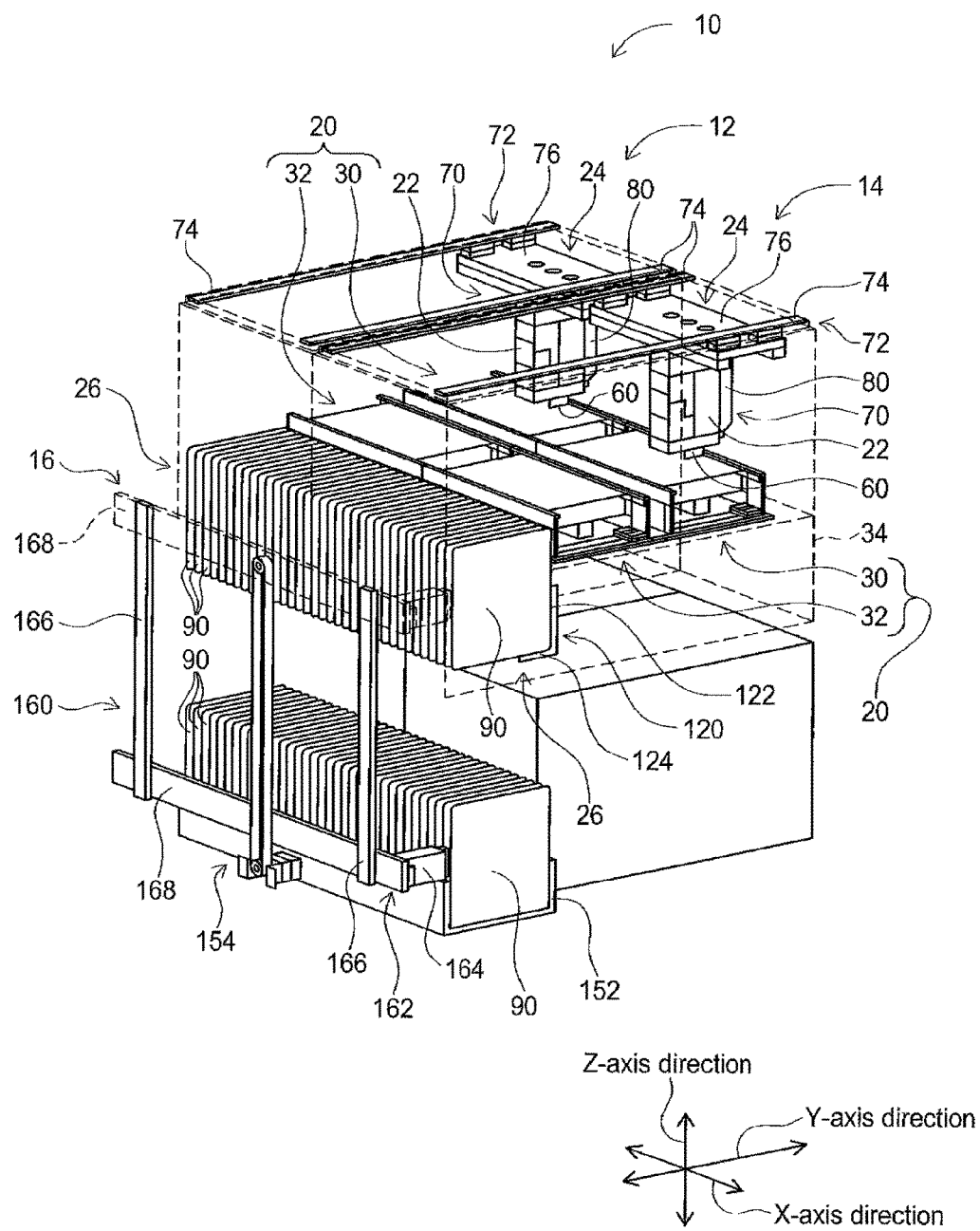
FIG. 1 is a perspective view showing a board work system that is an embodiment of the present disclosure.
Figure 2:
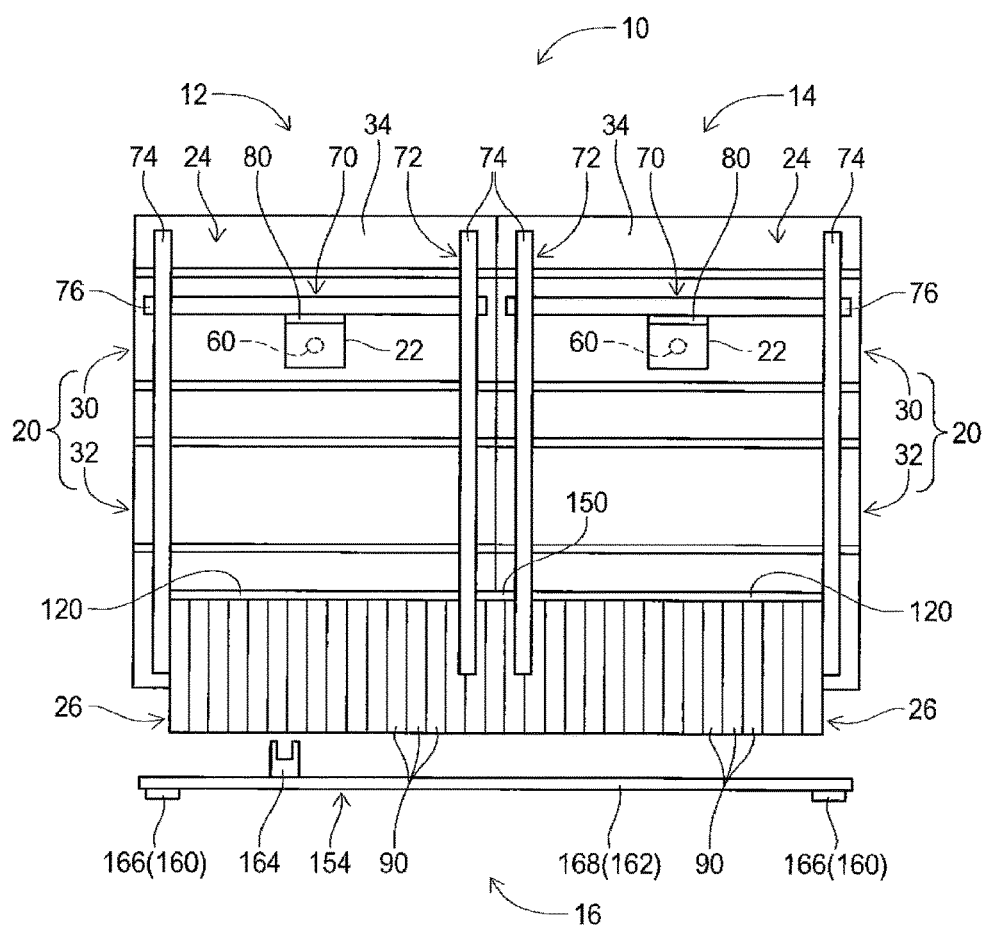
FIG. 2 is a plan view showing a board work system that is an embodiment of the present disclosure.

Board work system 10 is shown in FIGS. 1 and 2. System 10 shown in the diagrams is a system for mounting electronic components on a circuit board. Board work system 10 is configured from two electronic component mounters (hereinafter sometimes referred to as "mounters") 12 and 14, and feeder replacement device 16. The two mounters 12 and 14 are arranged adjacent to each other. Note that, in the description below, the direction in which mounters 12 and 14 are lined up is referred to as the X-axis direction, the direction horizontally perpendicular to the X-axis direction is referred to as the Y-axis direction, and the direction vertically perpendicular to the X-axis direction is referred to as the Z-axis direction.

The two mounters 12 and 14 have substantially the same configuration. Each mounter 12 and 14 is provided with conveyance device 20, mounting head 22, mounting head moving device (hereinafter sometimes referred to as "moving device") 24, and supply device 26.

Conveyance device 20 is provided with two conveyor devices 30 and 32. The two conveyor devices 30 and 32 are parallel to each other and are provided on base 34 extending in the X-axis direction. Each of the two conveyor devices 30 and 32 conveys circuit boards held by conveyor device 30 and 32 in the X-axis direction using electromagnetic motor (refer to FIG. 6) 36. Also, each conveyor device 30 and 32 has board holding device (refer to FIG. 6) 38 that fixedly holds a circuit board at a specified position.

Mounting head 22 mounts electronic components on a circuit board. In detail, mounting head 22 has suction nozzle 60 provided on a lower end thereof. Suction nozzle 60 is connected to a positive/negative pressure supply device (refer to FIG. 6) 62 via a negative pressure air/positive pressure air supply passage. Suction nozzle 60 picks up and holds an electronic component using negative pressure, and releases the held electronic component using positive pressure. Also, mounting head 22 has nozzle raising/lowering device (refer to FIG. 6) 64 that raises/lowers suction nozzle 60. Mounting head 22 changes the vertical position of a held electronic component by nozzle raising/lowering device 64. Note that, suction nozzle 60 is attachable/detachable to/from mounting head 22, so it is possible to change to a suction nozzle of a different size.

Moving device 24 moves mounting head 22 to any position on base 34. In detail, moving device 24 is configured from X-axis direction slide mechanism 70 and Y-axis direction slide mechanism 72. Y-axis direction slide mechanism 72 has a pair of Y-axis direction guide rails 74, and that pair of Y-axis direction guide rails 74 are provided extending in the Y-axis direction. On the other hand, X-axis direction slide mechanism 70 has X-axis direction guide rail 76, and that X-axis direction guide rail 76 extends in the X-axis direction supported by the pair of Y-axis direction guide rails 74. Y-axis direction slide mechanism 72 has electromagnetic motor (refer to FIG. 6) 78, and X-axis direction guide rail 76 is moved to any position in the Y-axis direction by the driving of electromagnetic motor 78. X-axis direction guide rail 76 holds slider 80 as to be movable along its own axis. X-axis direction slide mechanism 70 has electromagnetic motor (refer to FIG. 6) 82, and slider 80 is moved to any position in the X-axis direction by the driving of electromagnetic motor 82. Mounting head 22 is mounted on slider 80. According to such a structure, mounting head 22 is moved to any position on base 34 by moving device 24. Note that, because slider 80 can only move in the range in which Y-axis direction guide rails 74 and X-axis direction guide rails 76 are provided, moving device 24 cannot move to every position on base 34, but can move to any position within a specified range on base 34. Also, mounting head 22 is attachable/detachable to/from slider 80 with a single touch. By this, it is possible to change to different types of work heads such as a dispenser head.

Figure 3:
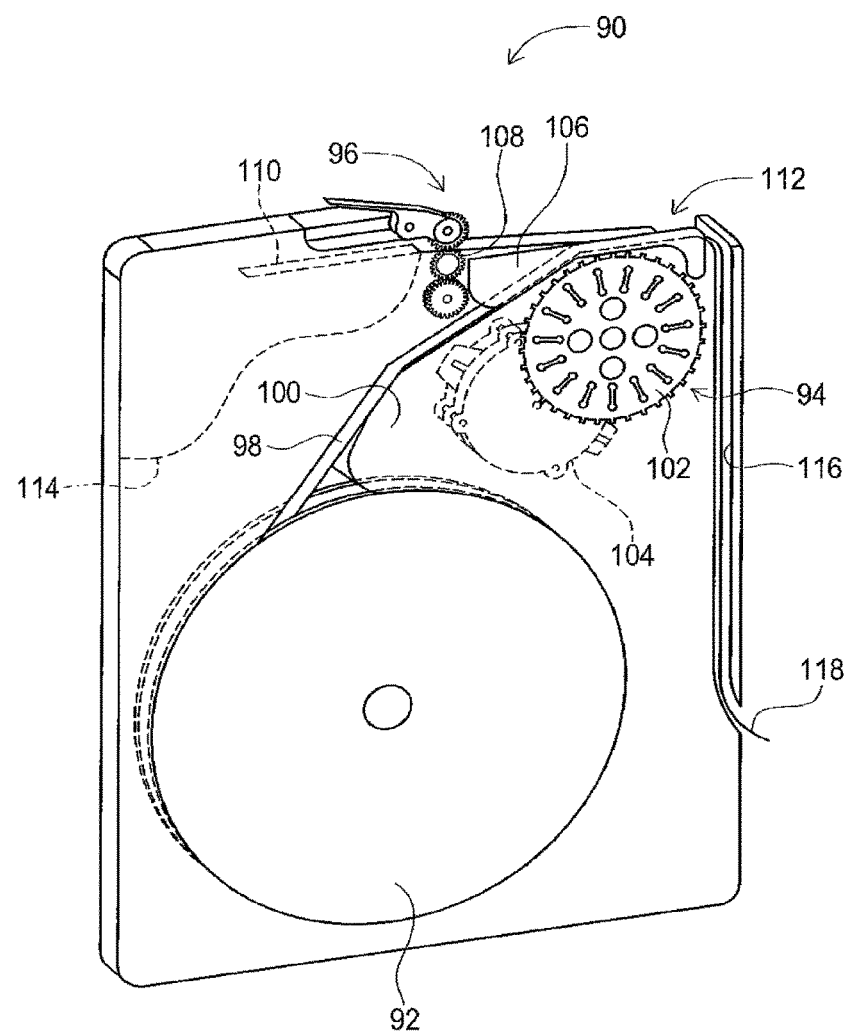
FIG. 3 is a perspective view of a tape feeder.

Supply device 26 is provided on the front end of base 34 and includes multiple tape feeders 90. As shown in FIG. 3, each tape feeder 90 includes reel 92, indexing device 94, and peeling device 96, and supplies electronic components from the end of the top surface of the feeder. In detail, taped components 98 are wound around reel 92, and taped components 98 are pulled out onto tape guide 100 from reel 92. Taped components are electronic components that have been put into tape in which indexing holes (not shown) are formed at a specified pitch. Sprocket 102 of indexing device 94 engages with the indexing holes. Also, sprocket 102 is rotated by electromagnetic motor 104. According to this kind of configuration, taped components 98 are indexed towards a supply position.

Also, peeling device 96 includes film peeling mechanism 106 and gear mechanism 108. Film peeling mechanism 106 peels top film 110 from taped components 98 and is provided in front of opening 112 which is formed on an upper end of tape feeder 90. Gear mechanism 108 pulls top film 110 peeled from taped components 98 into film collection section 114. According to this kind of configuration, by top film 110 being peeled from taped components 98, an electronic component stored in taped components 98 is exposed at opening 112, and the exposed electronic component is picked up and held by suction nozzle 60 of mounting head 22. That is, opening 112 is the electronic component supply position of tape feeder 90. Note that, tape guidance path 116 is formed in a side surface of opening 112 going down in the indexing direction of taped components 98. Waste tape 118 which is taped components 98 from which electronic components have been removed is ejected along tape guidance path 116.

Figure 4:
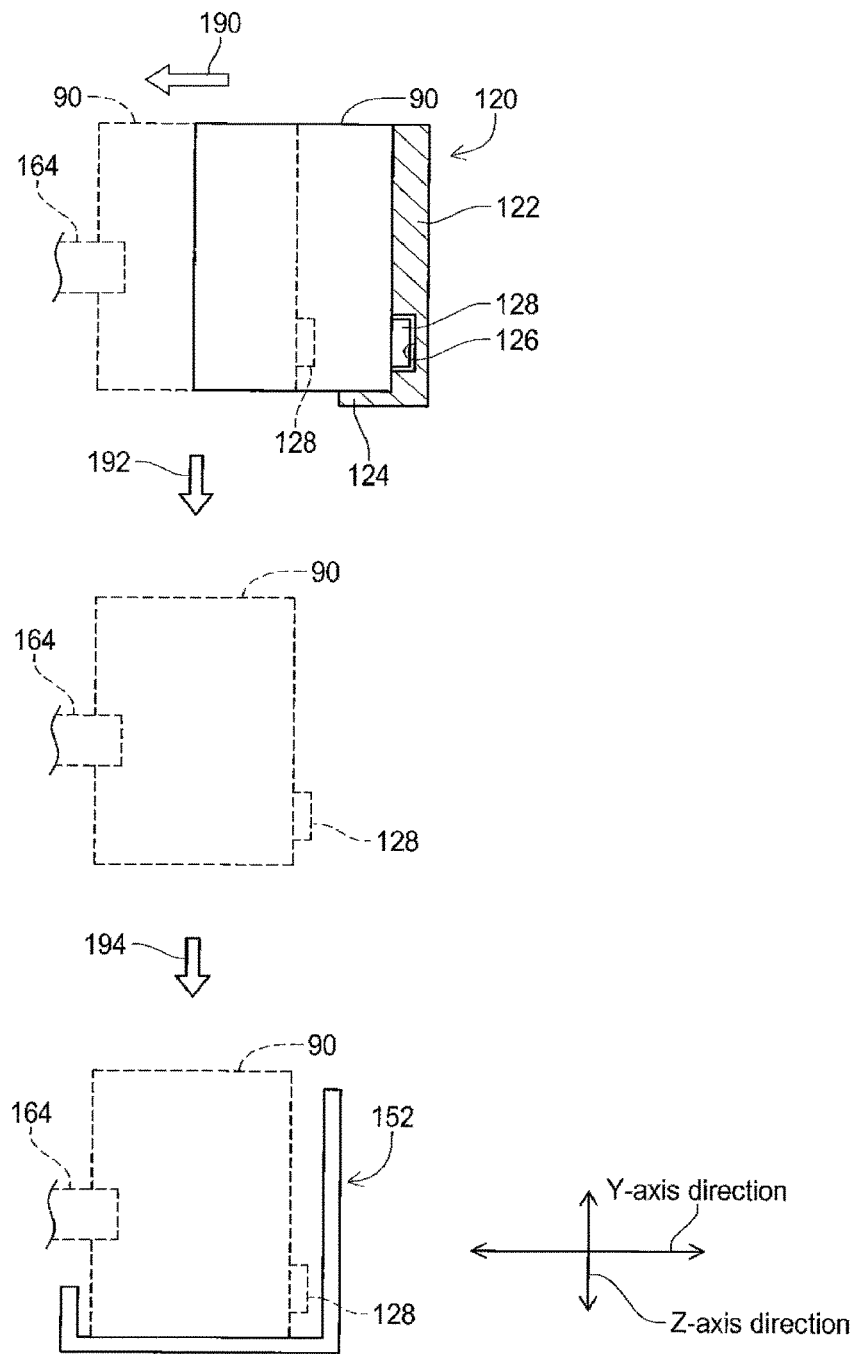
FIG. 4 shows a tape feeder being transferred from a tape feeder holding table to a tape feeder storage case.

Also, as shown in FIGS. 1 and 2, tape feeder 90 is attachable/detachable to/from tape feeder holding table 120 which is fixedly provided on the front end of base 34. As shown in FIG. 4, tape feeder holding table 120 is configured from upright surface section 122 provided upright in a vertical direction with respect to base 34, and protruding section 124 that protrudes from the bottom surface of upright surface section 122. Connector section 126 is provided in upright surface section 122. Conversely, connector 128 is provided on a side surface of tape feeder 90. Further, by connecting connector 128 of tape feeder 90 to connector section 126 of upright surface section 122, the bottom surface of tape feeder 90 is supported by protruding section 124. By this, tape feeder 90 is mounted on tape feeder holding table 120. Note that, tape feeder holding table 120 is provided within the movement range of mounting head 22 by moving device 24. By this, electronic components can be held by mounting head 22 from tape feeder 90 mounted on tape feeder holding table 120.

Figure 5:
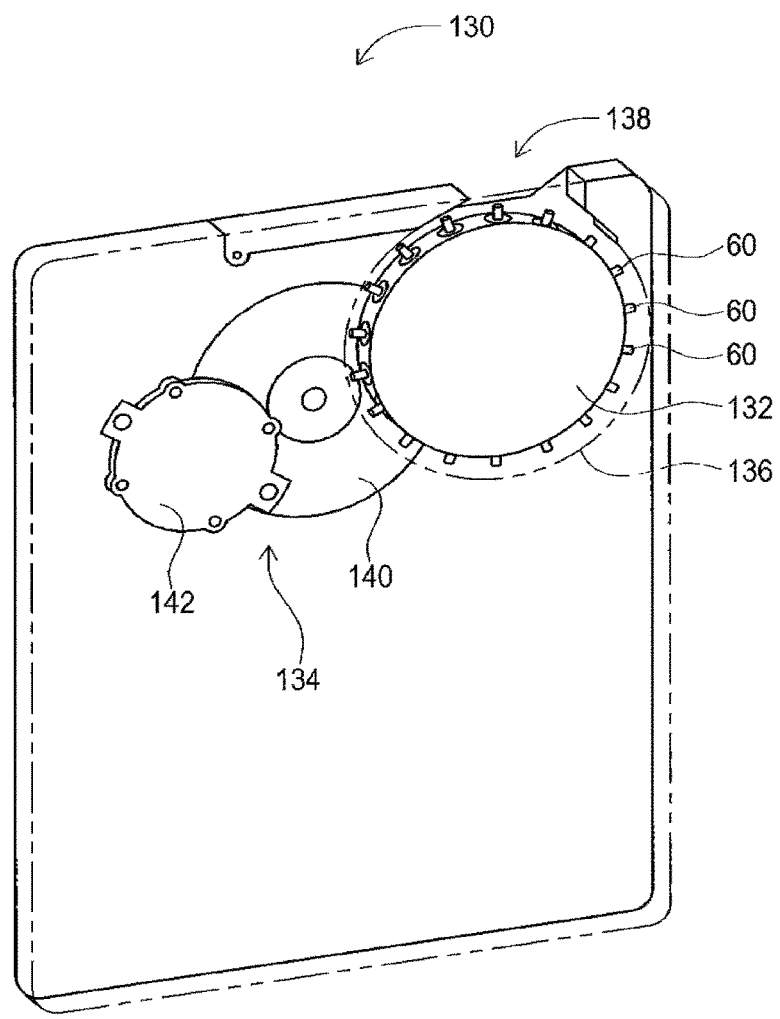
FIG. 5 is a perspective view showing a cassette-type nozzle storage unit.

Also, in addition to tape feeder 90, cassette-type nozzle storage unit 130 is detachably mounted on tape feeder holding table 120. Cassette-type nozzle storage unit 130 stores multiple types of suction nozzles 60 with different nozzle diameters and the like, and as shown in FIG. 5, includes nozzle station 132 and revolving device 134. Nozzle station 132 is disc-shaped, and multiple storage sections (not shown) are formed at an equal pitch on the circumference section of the disc. Storage sections store suction nozzle 60 and have a configuration capable of switching between a state in which stored suction nozzle 60 is clamped, and a state in which the clamp is released.

Disc-shaped nozzle station 132 is provided in mounting section 136 with the axis center of nozzle station 132 extending in a horizontal direction so as to be rotatable around the axis center. Opening section 138 that opens on the upper surface of cassette-type nozzle storage unit 130 is provided at the upper section of mounting section 136 and the outer circumference of nozzle station 132 is exposed via that opening section 138. Also, revolving device 134 includes gear mechanism 140 and electromagnetic motor 142, and the drive force of electromagnetic motor 142 is transmitted to nozzle station 132 via gear mechanism 140. By this, nozzle station 132 rotates around its axis center, and suction nozzles 60 stored in the storage section are moved to any position. That is, suction nozzle 60 can be supplied by suction nozzle 60 stored in the storage section being moved to the position at which suction nozzle 60 is exposed via opening section 138. Also, suction nozzle 60 can be stored in a storage section in which a suction nozzle 60 is not stored by being moved to a position at which the storage section is exposed via opening section 138. The same connector (not shown) as connector 128 provided in tape feeder 90 is provided in cassette-type nozzle storage unit 130, and by the connector of cassette-type nozzle storage unit 130 being connected to connector section 126 of tape feeder holding table 120, cassette-type nozzle storage unit 130 is attached to tape feeder holding table 120.

Also, as shown in FIGS. 1 and 2, feeder replacement device 16 is provided on the front of supply device 26 of the two mounters 12 and 14, and performs exchange of tape feeders 90 and so on mounted on tape feeder holding table 120. In detail, feeder replacement device 16 includes tape feeder storage table 150, tape feeder storage case 152, and replacement robot 154.

Tape feeder storage table 150 has the same configuration as tape feeder storage table 120, and tape feeders 90 and cassette-type nozzle storage units 130 can be mounted on tape feeder storage table 150. However, tape feeder storage table 150 is provided between tape feeder holding table 120 of mounter 12 and tape feeder holding table 120 of mounter 14, outside the movement range of mounting head 22 by moving device 24 of each of mounters 12 and 14. Thus, mounting head 22 of each of mounter 12 and 14 cannot pick up and hold an electronic component from tape feeder 90 mounted on tape feeder storage table 150.

Also, tape feeder storage case 152 is provided below tape feeder holding table 120 and tape feeder storage table 150. Tape feeder storage case 152 is divided into multiple slots (not shown) which are capable of storing tape feeder 90 or cassette-type nozzle storage unit 130, and a tape feeder 90 or cassette-type nozzle storage unit 130 is stored in each slot.

Note that, code reader (refer to FIG. 6) 156 is provided at each slot, and individual information of tape feeder 90 or cassette-type nozzle storage unit 130 is read by code reader 156. In detail, a code label (not shown) such as a barcode or two-dimensional code is affixed to tape feeder 90 and cassette-type nozzle storage unit 130. Identification information of tape feeder 90 or cassette-type nozzle storage unit 130 is recorded in the code label, and by identifying the code label by the code reader, the individual information of tape feeder 90 or cassette-type nozzle storage unit 130 is read. By this, it is possible to acquire information of each tape feeder 90 or cassette-type nozzle storage unit 130 stored in each slot of tape feeder storage case 152. Note that, code reader 156 may be provided on clamp mechanism 164 and so on instead of at the slot.

Also, replacement robot 154 includes raising/lowering device 160, horizontal moving device 162, and clamp mechanism 164. Raising/lowering device 160 includes a pair of Z-axis direction guide rails 166 and that pair of Z-axis direction guide rails 166 is provided on the front of tape feeder holding table 120, tape feeder storage table 150, and tape feeder storage case 152 extending in the Z-axis direction. Also, horizontal moving device 162 includes X-axis direction guide rail 168, and that X-axis direction guide rail 168 extends in the X-axis direction supported by a pair of Z-axis direction guide rails 166. Further, X-axis direction guide rail 168 is moved to any position in the Z-axis direction by the driving of Z-axis direction motor (refer to FIG. 6) 170. Also, X-axis direction guide rail 168 holds clamp mechanism 164 which is movable along an axis line of X-axis direction guide rail. Clamp mechanism 164 is moved to any position in the X-axis direction by the driving of X-axis direction motor (refer to FIG. 6) 172. Further, clamp mechanism 164 is expandable/contractible in the Y-axis direction, and expands/contracts in the Y-axis direction by the driving of expansion/contraction motor (refer to FIG. 6) 174. Also, a clamp section (not shown) that clamps tape feeder 90 or cassette-type nozzle storage unit 130 is provided on an end section of clamp mechanism 164. According to this kind of configuration, replacement robot 150, as explained in detail later, is capable of replacing tape feeder 90 or cassette-type nozzle storage unit 130 between tape feeder holding table 120, tape feeder storage table 150, and tape feeder storage case 152.

Figure 6:
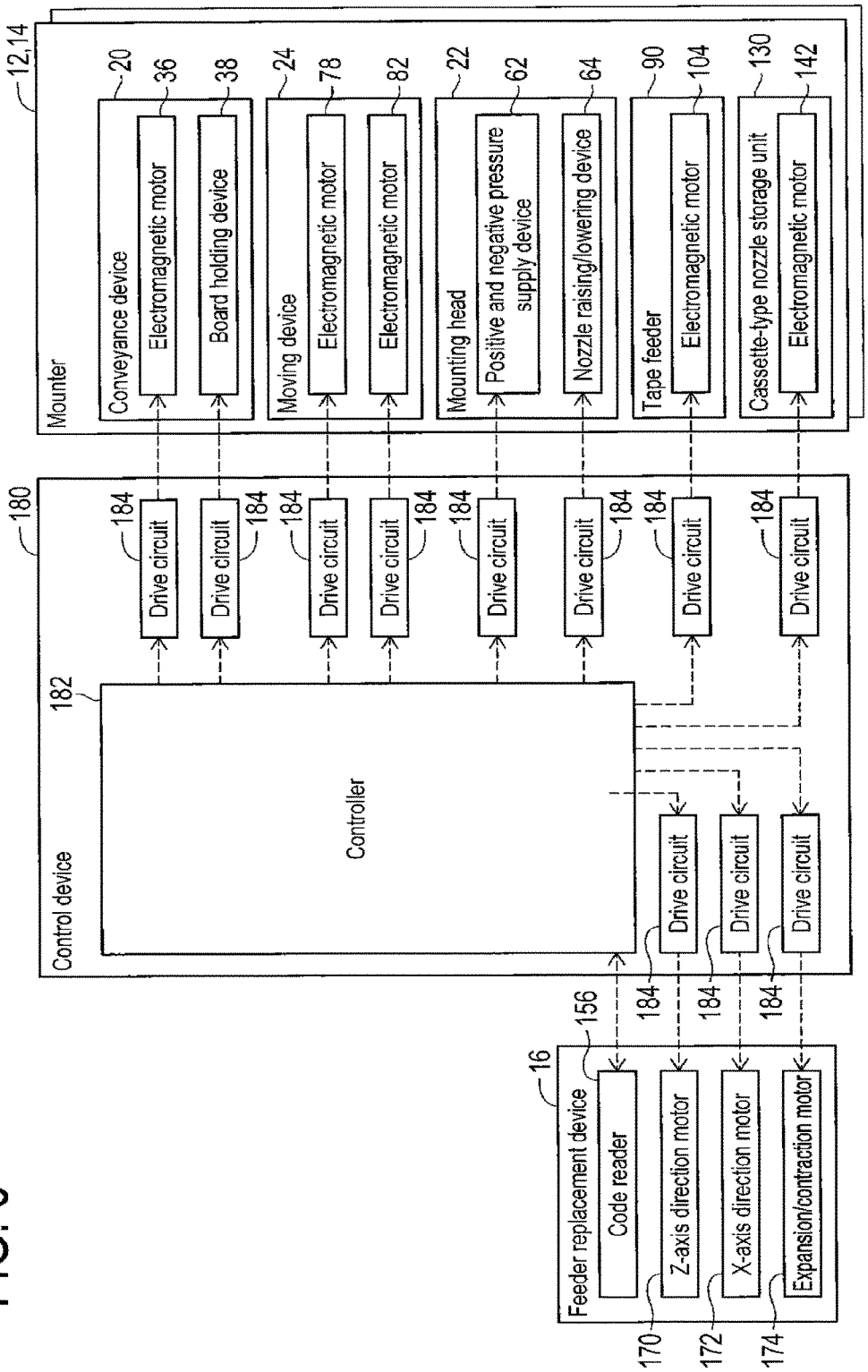
FIG. 6 is a block diagram showing the control device provided in the board work system.

Also, as shown in FIG. 6, board work system 10 is provided with control device 180. Control device 180 is provided with controller 182 and multiple drive circuits 184. The multiple drive circuits 184 are connected to the above electromagnetic motors 36, 78, 82, 104, 142, board holding device 38, positive/negative pressure supply device 62, nozzle raising/lowering device 64, Z-axis direction motor 170, X-axis direction motor 172, and expansion/contraction motor 174. Controller 182 is provided with a CPU, ROM, RAM, and so on, is formed mainly from a computer, and is connected to the multiple drive circuits 184. By this, the operation of conveyance device 20, moving device 24, and so on is controlled by controller 182. Also, controller 182 is connected to code reader 156 of feeder replacement device 16. By this, controller 182 acquires information of tape feeder 90 or the like stored in each slot of tape feeder storage case 152.

Mounting Work by the Board Work System

With board work system 10, work of mounting electronic components on a circuit board is perform according to the above configuration. Specifically, based on commands of controllers 182, a circuit board is loaded by conveyance device 20 of mounter 12, and conveyed to a work position. Then, at the work position, the circuit board is fixedly held by board holding device 38. Also, tape feeder 90 mounted on tape feeder holding table 120, based on commands of controller 182, indexes taped components so as to supply an electronic component to the supply position. Then, mounting head 22, based on commands of controller 182, moves above the supply position of the electronic component and picks up and holds the electronic component using suction nozzle 60. Continuing, mounting head 22, based on commands of controller 182, moves above the circuit board and mounts the held electronic component on the circuit board. When mounting work using mounter 12 is complete, based on commands of controller 182, the circuit board is unloaded from mounter 12 and loaded into mounter 14. Similar mounting work as in mounter 12 is performed in mounter 14, and when mounting work using mounter 14 is complete, based on commands of controller 182, the circuit board is unloaded from mounter 14. In this way, a circuit board on which electronic components are mounted is manufactured.

Also, suction nozzle 60 mounted on mounting head 22 is exchanged during mounting work and so on based on the dimensions of the electronic components and the like. Specifically, cassette-type nozzle storage unit 130 mounted on tape feeder holding table 120, based on commands of controller 182, revolves nozzle station 132 such that a storage section that is not storing a suction nozzle 60 is exposed via opening section 138. Meanwhile, mounting head 22, based on commands of controller 182, moves above opening section 138 of cassette-type nozzle storage unit 130. Then, mounting head 22 lowers the suction nozzle 60 mounted on mounting head 22 and stores the suction nozzle 60 in the storage section of nozzle station 132. Next, cassette-type nozzle storage unit 130, based on commands of controller 182, revolves nozzle station 132 such that a storage section storing a suction nozzle 60 is exposed via opening section 138. Then, mounting head 22, based on commands of controller 182, lowers the mounting section (not shown) of suction nozzle 60 and mounts the suction nozzle 60 on the mounting section. By this, the suction nozzle 60 mounted on mounting head 22 is exchanged.

Replacement of Tape Feeders and the Like Using the Board Work System

As given above, mounters 12 and 14 are configured to use suction nozzle 60 of mounting head 22 to pick up and hold an electronic component supplied by tape feeder 90, and then mount the held electronic component on a circuit board. With mounters 12 and 14 configured as such, it is necessary to deal with occurrences such as insufficiencies of electronic components, thus a tape feeder 90 mounted on tape feeder holding table 120 is capable of being exchanged with a new tape feeder 90.

With conventional mounters, tape feeder 90 exchange work is performed by an operator, and is troublesome work. Taking this into consideration, with board work system 10, tape feeder 90 exchange work is performed automatically. The automatic exchange work of tape feeders 90 using board work system 10 is described in detail below.

When the quantity of electronic components stored in tape feeder 90 becomes a specified quantity or fewer, that tape feeder (hereinafter sometimes referred to as "used feeder 90a") is removed from tape feeder holding table 120 by replacement robot 154. In detail, based on commands of controller 182, Z-axis direction motor 170 and X-axis direction motor 172 of raising/lowering device 160 and horizontal moving device 162 are driven such that clamp mechanism 164 is moved in front of used feeder 90a. Then, based on commands of controller 182, expansion/contraction motor 174 is driven such that clamp mechanism 164, by being extended, approaches used feeder 90a and clamps used feeder 90a. After used feeder 90a is clamped, based on commands of controller 182, expansion/contraction motor 174 is driven and clamp mechanism 164 is retracted. By this, as shown in FIG. 4, used feeder 90a is pulled out in the direction of arrow 190 and removed from tape feeder holding table 120.

Next, based on commands of controller 182, Z-axis direction motor 170 of raising/lowering device 160 is driven such that clamp mechanism 164 is moved in the direction (downwards) of arrow 192. By this, used feeder 90a clamped by clamp mechanism 164 is moved between tape feeder holding table 120 and tape feeder storage case 152. Then, based on commands of controller 182, X-axis direction motor 172 of horizontal moving device 162 is driven such that clamp mechanism 164 is moved in the X-axis direction. In this case, the driving of X-axis direction motor 172 is controlled such that used feeder 90a clamped by clamp mechanism 164 is moved above an empty slot of tape feeder storage case 152 in which no tape feeder 90 or the like is stored. Then, based on commands of controller 182, Z-axis direction motor 170 of raising/lowering device 160 is driven such that clamp mechanism 164 is moved in the direction (downwards) of arrow 194. By this, used feeder 90a clamped by clamp mechanism 164 is stored in an empty slot of tape feeder storage case 152. Note that, after used feeder 90a has been stored in the slot, clamp mechanism 164, based on commands of controller 182, releases the clamp of used feeder 90a and retracts. Also, at the slot in which planned-to-be-mounted feeder 90b is stored, by identifying the code label of used feeder 90a using code reader 156, individual information of used feeder 90a is read.

Continuing, in a case in which a tape feeder planned to be mounted on tape feeder holding table 120 instead of used feeder 90a (hereinafter sometimes referred to as "planned-to-be-mounted feeder 90b") is stored in tape feeder storage case 152, based on commands of controller 182, X-axis direction motor 172 of horizontal moving device 62 is driven such that clamp mechanism 164 is moved in front of planned-to-be-mounted feeder 90b. Then, expansion/contraction motor 174 is driven based on commands of controller 182, and by the extending of clamp mechanism 164, planned-to-be-mounted feeder 90b is approached and clamped.

Next, based on commands of controller 182, Z-axis direction motor 170 of raising/lowering device 160 is driven such that clamp mechanism 164 is moved upwards. By this, planned-to-be-mounted feeder 90b clamped by clamp mechanism 164 is moved in front of tape feeder holding table 120. Then, based on commands of controller 182, X-axis direction motor 172 of horizontal moving device 162 is driven such that clamp mechanism 164 is moved in the X-axis direction. Here, the driving of X-axis direction motor 172 is controlled such that planned-to-be-mounted feeder 90b clamped by clamp mechanism 164 is moved in front of tape feeder holding table 120 on which used feeder 90a was mounted.

Continuing, expansion/contraction motor 174 is driven based on commands of controller 182, and by the extending of clamp mechanism 164, planned-to-be-mounted feeder 90b is approached and mounted on tape feeder holding table 120. Then, after planned-to-be-mounted feeder 90b is mounted on tape feeder holding table 120, clamp mechanism 164, based on commands of controller 182, releases the clamp of planned-to-be-mounted feeder 90b and retracts. By the operation of replacement robot 154 to perform the above series of actions, automatic replacement of used feeder 90a and planned-to-be-mounted feeder 90b is performed.

Also, as shown in FIG. 4, with board work system 10, the length of protruding section 124 is half or less than the length of the bottom surface of tape feeder 90. Thus, when removing tape feeder 90 from tape feeder holding table 120, the movement amount in the forward/back direction, that is the Y-axis direction, of tape feeder 90 is able to be made small. By this, it is possible to perform the removal of tape feeder 90 from tape feeder holding table 120 smoothly, and the space that the device occupies in the Y-axis direction is able to be made small.

Also, in a case in which planned-to-be-mounted feeder 90b is stored on tape feeder storage table 150, after used feeder 90a is stored in tape feeder storage case 152, based on commands of controller 182, Z-axis direction motor 170 and X-axis direction motor 172 of raising/lowering device 160 and horizontal moving device 162 are driven such that clamp mechanism 164 is moved in front of planned-to-be-mounted feeder 90b. Then, expansion/contraction motor 174 is driven based on commands of controller 182, and by the extending of clamp mechanism 164, planned-to-be-mounted feeder 90b is approached and clamped. Since the process after planned-to-be-mounted feeder 90b has been clamped is the same as the process described above, descriptions are omitted.

In this way, with board work system 10, planned-to-be-mounted feeder 90b is able to be stored on not just tape feeder storage case 152, but also tape feeder storage table 150. The arrangement space of tape feeder storage table 150 is positioned outside the movement range of mounting head 22 by moving device 24 of both mounter 12 and mounter 14, and is thus dead space. That is, with board work system 10, dead space is used as storage space of tape feeders 90 and so on, such that many tape feeders 90 can be stored.

Also, with board work system 10, as well as the replacement of used feeder 90a with planned-to-be-mounted feeder 90b, a tape feeder mounted on tape feeder holding table 120 of mounter 12 (hereinafter sometimes referred to as "transfer feeder 90c") is able to be freely transferred to tape feeder holding table 120 of mounter 14. Specifically, based on commands of controller 182, Z-axis direction motor 170 and X-axis direction motor 172 of raising/lowering device 160 and horizontal moving device 162 are driven such that clamp mechanism 164 is moved in front of transfer feeder 90c mounted on tape feeder holding table 120 of mounter 12. Then, expansion/contraction motor 174 is driven based on commands of controller 182, and by the extending of clamp mechanism 164, transfer feeder 90c is approached and clamped. After transfer feeder 90c is clamped, based on commands of controller 182, expansion/contraction motor 174 is driven and clamp mechanism 164 is retracted. By this, transfer feeder 90c is removed from tape feeder holding table 120 of mounter 12.

Next, based on commands of controller 182, X-axis direction motor 172 of horizontal moving device 162 is driven such that clamp mechanism 164 is moved in the X-axis direction. Here, the driving of X-axis direction motor 172 is controlled such that transfer feeder 90c clamped by clamp mechanism 164 is moved in front of tape feeder holding table 120 of mounter 14 on which no tape feeder 90 or the like is mounted. Continuing, expansion/contraction motor 174 is driven based on commands of controller 182, and by the extending of clamp mechanism 164, tape feeder holding table 120 of mounter 14 is approached and transfer feeder 90c is mounted on tape feeder holding table 120 of mounter 14. After transfer feeder 90c is mounted on tape feeder holding table 120 of mounter 14, clamp mechanism 164, based on commands of controller 182, releases the clamp of transfer feeder 90c and retracts.

Also, in a case in which there is no space for mounting transfer feeder 90c on tape feeder holding table 120 of mounter 14, transfer feeder 90c is transferred from tape feeder holding table 120 of mounter 12 to tape feeder holding table 120 of mounter 14 after making space available on tape feeder holding table 120 of mounter 14 for mounting transfer feeder 90c. Specifically, based on commands of controller 182, Z-axis direction motor 170 and X-axis direction motor 172 of raising/lowering device 160 and horizontal moving device 162 are driven such that clamp mechanism 164 is moved in front of tape feeder 90 mounted on tape feeder holding table 120 of mounter 12. Note that, this tape feeder 90 is a tape feeder that stores electronic components which are not to be used on mounter 14 (hereinafter sometimes referred to as "unnecessary tape feeder 90d").

After clamp mechanism 164 moves in front of unnecessary tape feeder 90d, expansion/contraction motor 174 is driven based on commands of controller 182, and by the extending of clamp mechanism 164, tape feeder holding table 120 of mounter 14 is approached and unnecessary tape feeder 90d is clamped. After unnecessary tape feeder 90d is clamped, based on commands of controller 182, expansion/contraction motor 174 is driven and clamp mechanism 164 is retracted. By this, unnecessary tape feeder 90d is removed from tape feeder holding table 120 of mounter 14.

Next, based on commands of controller 182, X-axis direction motor 172 of horizontal moving device 162 is driven such that clamp mechanism 164 is moved in the X-axis direction. Here, the driving of X-axis direction motor 172 is controlled such that unnecessary tape feeder 90d clamped by clamp mechanism 164 is moved in front of tape feeder storage table 150 on which no tape feeder 90 or the like is mounted. Then, expansion/contraction motor 174 is driven based on commands of controller 182, and by the extending of clamp mechanism 164, tape feeder storage table 150 is approached and unnecessary tape feeder 90d is mounted on tape feeder storage table 150. Note that, in a case in which there are multiple empty slots on tape feeder storage table 150, unnecessary tape feeder 90d is stored in a slot close to tape feeder holding table 120 of mounter 14 out of the multiple empty slots. By this, the movement time of unnecessary tape feeder 90d is made short.

After unnecessary tape feeder 90d is mounted on tape feeder storage table 150, clamp mechanism 164, based on commands of controller 182, releases the clamp of unnecessary tape feeder 90d and retracts. By this, space for mounting transfer feeder 90c is made available on tape feeder holding table 120 of mounter 14. Since the process for transferring transfer feeder 90c mounted on tape feeder holding table 120 of mounter 12 is the same as the process described above, descriptions are omitted. In this way, with board work system 10, tape feeder 90 mounted on tape feeder holding table 120 of one of mounter 12 and mounter 14 is able to be transferred to tape feeder holding table 120 of the other one of mounter 12 and mounter 14 automatically. By this, it is possible to optimize the work time at each of mounters 12 and 14.

Specifically, for example, in a case in which the simulation result of a production program of both mounter 12 and mounter 14 is 11 seconds, there are cases in which, when actual production is performed, the work time for one circuit board is 12 seconds at mounter 12, but the work time for one circuit board is 10 seconds at mounter 14. In this case, the time required to manufacture one circuit board using board work system 10 is 12 seconds. In this case, by performing a portion of the mounting work of mounter 12 using mounter 14, the work time for one circuit board at mounter 12 becomes 11 seconds, and the work time for one circuit board at mounter 14 becomes 11 seconds. That is, by transferring transfer feeder 90c mounted on tape feeder holding table 120 of mounter 12 to tape feeder holding table 120 of mounter 14 automatically, the work of mounting electronic components stored in that transfer feeder 90c is able to be performed at mounter 14 instead of at mounter 12. By this, it is possible to make the work time for one circuit board at mounter 12 become 11 seconds, and the work time for one circuit board at mounter 14 become 11 seconds, such that the time required to manufacture one circuit board using board work system 10 becomes 11 seconds. In this way, with board work system 10, by transferring tape feeders 90 between tape feeder holding table 120 of mounter 12 and tape feeder holding table 120 of mounter 14, it is possible to optimize the work time of each of mounters 12 and 14, thus shortening the time required to manufacture one circuit board using board work system 10. Note that, the transfer of tape feeders 90 between tape feeder holding table 120 of mounter 12 and tape feeder holding table 120 of mounter 14 may be performed during production of a circuit board. By transferring tape feeders 90 during production of a circuit board, it is possible to optimize work time without interrupting production, which is extremely beneficial.

Also, by transferring tape feeders 90 between tape feeder holding table 120 of mounter 12 and tape feeder holding table 120 of mounter 14, it is possible to share one tape feeder 90 across two mounters 12 and 14. By this, it is not necessary to mount a tape feeder 90 in which the same electronic component is stored on each of the tape feeder holding tables 120 of the two mounters 12 and 14, thus costs are reduced. Furthermore, when the type of circuit board being manufactured changes, exchange of tape feeders 90, commonly known as changeover, is performed, in which case tape feeders 90 mounted on tape feeder holding table 120 of mounters 12 and 14 can be used as tape feeders for exchange during changeover.

Also, with board work system 10, as well as transfer of tape feeders 90, it is possible to perform transfer of cassette-type nozzle storage units 130 between tape feeder holding table 120 of mounter 12 and tape feeder holding table 120 of mounter 14. By this, it is possible to share one cassette-type nozzle storage unit 130 between two mounters 12 and 14, thus costs are reduced. Note that, since transfer of cassette-type nozzle storage units 130 is performed by the same process as transfer of tape feeders 90, descriptions are omitted.

Note that, in the above embodiment, board work system 10 is an example of a board work system. Mounters 12 and 14 are an example of a work machine. Feeder replacement device 16 is an example of a transfer device. Conveyance device 20 is an example of a conveyance device. Mounting head 22 is an example of a mounting head. Moving device 24 is an example of a moving head. Supply device 26 is an example of a supply device. Suction nozzle 60 is an example of a suction nozzle. Tape feeder 90 is an example of a feeder. Tape feeder holding table 120 is an example of a feeder loading section. Protruding section 124 is an example of a bottom surface support section. Cassette-type nozzle storage unit 130 is an example of a nozzle storage unit. Tape feeder storage table 150 is an example of a first storage section. Tape feeder storage case 152 is an example of a second storage section.

Further, the present disclosure is not limited to the above example embodiment, and various changed or improved methods of embodiment are possible based on the knowledge of someone skilled in the art. Specifically, for example, in the above embodiment, transfer of tape feeders 90 between tape feeder holding table 120 of the two mounters 12 and 14 is performed using feeder replacement device 16, but in a case in which the configuration is such that feeder replacement device 16 is capable of transfer to a mounter adjacent to the mounter to which replacement device 16 is attached, it is possible to transfer tape feeders 90 and so on between tape feeder holding table 120, tape feeder storage table 150, and tape feeder storage case 152 of three or more mounters.

Also, in the above embodiment, tape feeders 90 are used as feeders to be transferred using feeder replacement device 16, but other types of feeders such as bulk feeders may also be used.

REFERENCE NUMERALS LIST

10: board work system; 12: mounter (work machine); 14: mounter (work machine); 16: feeder replacement device (replacement device); 20: conveyance device: 22: mounting head; 24: moving device; 26: supply device; 60: suction nozzle; 90: tape feeder (feeder); 120: tape feeder holding table (feeder loading section); 124: protruding section (bottom surface support section); 130: cassette-type nozzle storage unit; 150: tape feeder storage table (first storage section); 152: tape feeder storage case (second storage section)

The invention claimed is:

1. A board work system including multiple work machines arranged in a line each of the work machines configured to mount electronic components on a circuit board conveyed through the work machines, the board work system comprising:
   a component supply device which includes a first feeder loading section on which a first feeder which supplies the electronic components is detachably loaded, and a second feeder loading section on which a second feeder which supplies the electronic components is detachably loaded, the first feeder loading section included with a first work machine of the multiple work machines and the second feeder loading section included with a second work machine of the multiple work machines;
   a first storage section to store either of the first feeder or the second feeder, the first storage section being in line with and between the first feeder loading section and the second feeder loading section; and
   a transfer device that transfers either of the first feeder or the second feeder between the first feeder loading section of the first work machine, the second feeder loading section of the second work machine which is adjacent to the first work machine, and the first storage section.

2. The board work system according to claim 1, further comprising:
   a second storage section to store either of the first feeder or the second feeder, the second storage section being below the first feeder loading section, the second feeder loading section, and the first storage section, wherein the transfer device transfers either of the first feeder or the second feeder between the first feeder loading section of the first work machine, the second feeder loading section of the second work machine, the first storage section, and the second storage section.

3. The board work system according to claim 2,
   wherein the component supply device includes a nozzle storage unit, which stores at least one suction nozzle for picking up and holding an electronic component, that is detachably loaded on the first feeder loading section, and
   wherein the transfer device transfers the nozzle storage unit between the first feeder loading section and the second storage section.

4. The board work system according to claim 1,
   wherein the first feeder loading section includes a bottom surface support section that supports a bottom surface of the first feeder from below,
   further wherein a length of the bottom surface support section is shorter than a length of the bottom surface of the first feeder.

* * * * *